(12) United States Patent
Zhang

(10) Patent No.: US 12,277,064 B2
(45) Date of Patent: Apr. 15, 2025

(54) METHOD FOR OPERATING MEMORY SYSTEM, MEMORY CONTROLLER, MEMORY SYSTEM AND ELECTRONIC DEVICE

(71) Applicant: Yangtze Memory Technologies Co., Ltd., Hubei (CN)

(72) Inventor: Tao Zhang, Wuhan Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 140 days.

(21) Appl. No.: 18/091,025

(22) Filed: Dec. 29, 2022

(65) Prior Publication Data
US 2024/0168886 A1     May 23, 2024

Related U.S. Application Data

(63) Continuation of application No. PCT/CN2022/132692, filed on Nov. 17, 2022.

(51) Int. Cl.
| | |
|---|---|
| *G06F 12/08* | (2016.01) |
| *G06F 12/02* | (2006.01) |
| *G06F 12/0891* | (2016.01) |
| *G06F 12/14* | (2006.01) |

(52) U.S. Cl.
CPC ........ G06F 12/0891 (2013.01); G06F 12/023 (2013.01); G06F 12/1425 (2013.01)

(58) Field of Classification Search
CPC ........ G06F 12/08; G06F 12/02; G06F 12/023; G06F 12/04; G06F 12/1425; G06F 12/0891
See application file for complete search history.

(56) References Cited

U.S. PATENT DOCUMENTS

| | | | |
|---|---|---|---|
| 11,188,245 B2 | 11/2021 | Wen et al. | |
| 2016/0077968 A1* | 3/2016 | Sela | G06F 12/0246 |
| | | | 711/118 |
| 2021/0157720 A1* | 5/2021 | Bert | G06F 3/0608 |
| 2021/0240613 A1* | 8/2021 | Na | G06F 12/0253 |

(Continued)

FOREIGN PATENT DOCUMENTS

| | | | |
|---|---|---|---|
| CN | 108228478 A | 6/2018 | |
| CN | 111562880 A | 8/2020 | |
| EP | 1890290 A2 * | 2/2008 | ....... G11B 20/00086 |

OTHER PUBLICATIONS

X. Chen, Y. Li and T. Zhang, "Reducing Flash Memory Write Traffic by Exploiting a Few MBs of Capacitor-Powered Write Buffer Inside Solid-State Drives (SSDs)," in IEEE Transactions on Computers, vol. 68, No. 3, pp. 426-439, Mar. 1, 2019.*

(Continued)

*Primary Examiner* — Pierre Michel Bataille
(74) *Attorney, Agent, or Firm* — Oblon, McClelland, Maier & Neustadt, L.L.P.

(57) ABSTRACT

A method for operating a memory system relates to the memory field and aims to address problems such as the over-long waiting time caused by moving data during the buffer flush process. The method for operating the memory system includes: in response to a first space flush command, configuring a part of the free space as the available space of the first space in the case where the size of the free space of the memory device is greater than or equal to the first threshold.

20 Claims, 7 Drawing Sheets

(56) References Cited

U.S. PATENT DOCUMENTS

| | | | |
|---|---|---|---|
| 2022/0269434 A1* | 8/2022 | Shin | G06F 3/0631 |
| 2023/0024660 A1* | 1/2023 | Hsiao | G06F 3/0659 |
| 2023/0043338 A1* | 2/2023 | Bi | G06F 3/0679 |
| 2023/0376206 A1* | 11/2023 | Wang | G06F 3/061 |

OTHER PUBLICATIONS

International Search Report issued on Jul. 1, 2023 in PCT/CN2022/132692 filed Nov. 17, 2022 (with English Translation of Category of Cited Documents), 4 pages.

* cited by examiner

METHOD FOR OPERATING MEMORY SYSTEM, MEMORY CONTROLLER, MEMORY SYSTEM AND ELECTRONIC DEVICE

CROSS REFERENCE TO RELATED APPLICATION

The present application claims priority to a Patent Cooperation Treaty Application No. PCT/CN2022/132692, "An method for operation memory system, memory controller, memory system and electronic device", filed on Nov. 17, 2022. The entire disclosure of the application is hereby incorporated by reference in its entirety.

TECHNICAL FIELD

The present disclosure relates to the field of memory technologies, and in particular to a method for operating a memory system, a memory controller, a memory system, and an electronic device.

BACKGROUND

Write booster refers to configuring a part of a regular space of a flash memory as a single-level cell (SLC) flash memory, for example, configuring a triple-level cell (TLC) flash memory as an SLC flash memory, and configuring the SLC flash memory as a write boostered buffer space. When writing data, the data are first written into the SIC flash memory instead of the TLC flash memory having a slower write speed, so that the write demand can be processed with less delay and the overall storage performance is improved.

SUMMARY

Implementations of the present disclosure provide a method for operating a memory system, a memory controller, a memory system, and an electronic device, which are used to alleviate problems such as long waiting time for buffer space flush caused by moving data.

To achieve the above object, the implementations of the present disclosure adopt the following technical solutions.

In one aspect of the disclosure, a method for operating a memory system is provided, which is applied to a memory controller. The memory controller is coupled to a memory device, and the memory device includes a first space and a second space. A storage mode of the first space is a first mode, a storage mode of the second space is a second mode. The write speed of the second mode is lower than that of the first mode, but storing data of the same size in the first mode occupies more storage space than in the second mode. The method for operating the memory system includes: in response to a first space flush command, configuring a part of a free space of the memory device as an available space of the first space in a case where a size of the free space is greater than or equal to a first threshold, wherein the free space of the memory device includes the available space of the first space and an available space of the second space.

In accordance with the method for operating the memory system provided by the implementations of the present disclosure, when flushing the first space, there is no need to move the data already stored in the first space if the size of the free space of the memory device is greater than or equal to the first threshold; instead, a part of the free space is configured as the available space of the first space. That is, when the first space needs to be flushed, there is no need to release the first space by moving the data stored in the first space, and another part of the space is configured as the first space. In this way, on one hand, the problem of a long waiting time caused by moving data can be alleviated. On the other hand, it may reduce the number of times of writing data due to moving data, and may prolong the service life of the memory device. The data are still stored at a faster speed in the first mode, reading speed is faster as well, which can improve the read and write performances of the memory device.

In some implementations, after configuring a part of the free space as the available space of the first space, the size of the available space of the first space is restored into the initial value, that is, the same as the size of the first space. Or it may be considered that all the first space is available, and flush of the first space is completed.

In some implementations, the memory controller stores a parameter representing the size of the available space of the first space. The parameter representing the size of the available space of the first space includes an occupancy ratio of the size of the available space of the first space to a size of the first space. After configuring the part of the free space as the available space of the first space, the method further includes: configuring the parameter representing the size of the available space of the first space as an initial value, such as 100%. The host may inquire the memory controller for the parameter representing the size of the available space of the first space. When the host inquires that the parameter representing the size of the available space of the first space is restored to the initial value, it may be confirmed that the memory system has completed the flush of the first space.

In some implementations, the method for operating the memory system further includes: in a case where the size of the free space is smaller than the first threshold, storing data stored in the first mode into the free space in the second mode. In this case, the size of the free space is insufficient, the first space cannot be configured, and the data stored in the first mode occupies more space than the data of the same size stored in the second mode. Thus, when the data stored in the first mode are stored into the free space in the second mode, a part of the free space can be released for configuring the first space.

In some implementations, the memory device includes a third space, and storing the data stored in the first mode into the free space in the second mode includes: in a case where the size of the free space is zero, storing the data stored in the first mode into the third space in the second mode; and moving the data stored in the second mode in the third space to the free space. The third space is generally not used as the second space for storing data, but for implementing data movement or storing some data of the memory device itself. When the size of the free space of the memory device is zero, there is no free space to store data. Therefore, the data stored in the first mode are stored into the third space in the second mode, so as to release some free space. Then the data stored in the second mode in the third space are moved to the released free space, so that the third space is also released to complete the data movement when the size of the free space is zero. Such moving of the data stored in the first mode can release a part of the free space for configuring the first space.

In some implementations, the method for operating the memory system further includes: in a case where the size of the free space is smaller than the first threshold, if there is no data stored in the first mode, that is, if all the data stored in the first mode has been moved, on one hand, the size of the free space is insufficient to configure the first space, and on the other hand, it is impossible to release more free space by moving the data stored in the first mode. In this case, the size of the first space is configured as the size of the free space, that is, the size of the first space is reduced, so as to complete flushing of first space. After the reduction, the size of the free space is the same as the size of the reduced first space, so that the first space can be configured to complete flushing of the first space.

In some implementations, the memory controller stores a parameter representing the size of the available space of the first space. The parameter representing the size of the available space of the first space includes an occupancy ratio of the size of the available space of the first space to the size of the first space. Before configuring the part of the free space as the available space of the first space, the method for operating the memory system further includes: sending the parameter representing the size of the available space of the first space to a host; and receiving the first space flush command sent by the host in response to the parameter representing the size of the available space of the first space. The memory controller will not execute the flushing of the first space until it receives the first space flush command sent by the host.

In some implementations, the size of the first threshold is equal to the size of the first space, and the size of the first space is generally set according to the demand of the host. In this way, the size of the first space is used as a benchmark. When the size of the free space is greater than or equal to the first threshold, data may not be moved, and a part of the free space may be configured as the available space of the first space so as to complete the flash of the first space. If the size of the free space is smaller than the first threshold, it is necessary to move the data stored in the first mode, release more free space, and then configure the first space that meets the demand of the host.

In some examples, the first mode includes a single-level cell (SLC) mode, and the second mode includes a multi-level cell (MLC) mode, a three-level cell (TLC) mode, or a quad-level cell (QLC) mode.

In another aspect of the disclosure, a memory controller is provided. The memory controller is coupled to a memory device. The memory device includes a first space and a second space, a storage mode of the first space is a first mode, and a storage mode of the second space is a second mode. A write speed of the second mode is lower than that of the first mode. The memory controller includes a first interface circuit and a processor. The first interface circuit is configured to receive a first space flush command. The processor is configured to, in response to the first space flush command, configure a part of a free space of the memory device as an available space of the first space in a case where a size of the free space is greater than or equal to a first threshold, where the free space of the memory device includes the available space of the first space and an available space of the second space.

In some implementations, the memory controller includes a random access memory. The random access memory stores a parameter representing a size of the available space of the first space. The parameter representing the size of the available space of the first space includes an occupancy ratio of the size of the available space of the first space to the size of the first space. The processor is configured to configure the parameter representing the size of the available space of the first space stored in the random access memory as an initial value, after configuring the part of the free space as the available space of the first space.

In some implementations, the processor is further configured to store data stored in the first mode into the free space in the second mode, in a case where the size of the free space is smaller than the first threshold.

In some implementations, the memory device includes a third space, and the processor is specifically configured to store the data stored in the first mode into the third space in the second mode in a case where the size of the free space is zero, and move the data stored in the second mode in the third space to the free space.

In some implementations, the processor is further configured to, in a case where the size of the free space is smaller than the first threshold, configure the size of the first space as the size of the free space if there is no data stored in the first mode.

In yet another aspect of the disclosure, a memory system is provided, which includes a memory device and a memory controller. The memory controller is coupled to the memory device. The memory device includes a first space and a second space, a storage mode of the first space is a first mode, and a storage mode of the second space is a second mode. A write speed of the second mode is lower than that of the first mode. The memory controller is configured to: in response to a first space flush command, configure a part of a free space of the memory device as an available space of the first space in a case where a size of the free space is greater than or equal to a first threshold. The free space of the memory device includes the available space of the first space and an available space of the second space.

In some implementations, the memory controller includes a random access memory. The random access memory stores a parameter representing a size of the available space of the first space, and the parameter representing the size of the available space of the first space includes an occupancy ratio of the size of the available space of the first space to a size of the first space. The memory controller is configured to: after configuring the part of the free space as the available space of the first space, configure the parameter representing the size of the available space of the first space as an initial value.

In some implementations, the memory controller is further configured to: in a case where the size of the free space is smaller than the first threshold, store the data stored in the first mode into the free space in the second mode.

In some implementations, the memory device includes a third space, and the memory controller is configured to: store the data stored in the first mode into the third space in the second mode in a case where the size of the free space is zero: and move the data stored in the second mode in the third space to the free space.

In some implementations, the memory controller is further configured to: in a case where the size of the free space is smaller than the first threshold, configure the size of the first space as the size of the free space if there is no data stored in the first mode.

In yet another aspect of the disclosure, an electronic device is provided, which includes a host and the memory system provided by in the aforementioned aspects, and the host is connected to the memory system to write data into the memory system or read data stored in the memory system.

In some implementations, the host is configured to send a first space flush command to the memory system.

In some implementations, the memory system is configured to send a parameter representing the size of the available space of the first space to the host, where the parameter representing the size of the available space of the first space includes an occupancy ratio of the size of the available space of the first space to the size of the first space. The host is configured to send the first space Bush command to the memory system in response to the parameter representing the size of the available space of the first space.

It can be understood that the beneficial effects that may be achieved by the memory controller, the memory system and the electronic device provided by the above implementations of the present disclosure may reference the beneficial effects of the method for operating the memory system above, which will not be repeated here.

BRIEF DESCRIPTION OF THE DRAWINGS

The accompanying drawings required in some implementations of the present disclosure will be briefly explained below to set forth the technical solutions in the present disclosure more clearly. It is apparent that the accompanying drawings in the following description are merely drawings for some implementations of the present disclosure. Additional drawings may be obtained for those of ordinary skill in the art based on these drawings. In addition, the drawings used in the following description may be regarded as schematic diagrams, and are not limitations on the actual size of the product involved in the implementations of the present disclosure, the actual process of the method, the actual timing of signals, and the like.

DETAILED DESCRIPTION

The technical solutions in some implementations of the present disclosure will be clearly and completely described below in combination with the accompanying drawings. Apparently, the described implementations are merely some of the implementations of the present disclosure, not all of them. All other implementations obtained by persons of ordinary skill in the art based on the implementations provided in the present disclosure fall within the scope of the present disclosure.

Figure 1:
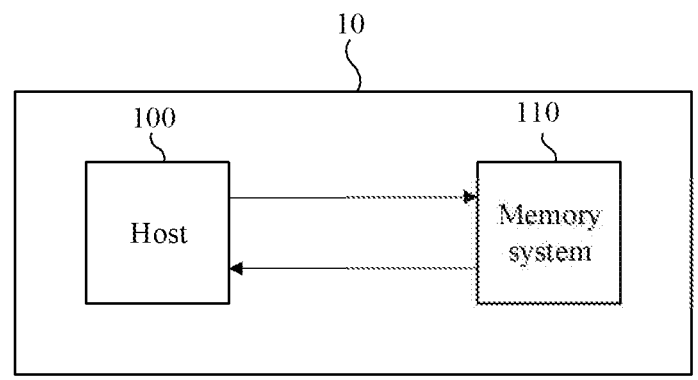
FIG. 1 is a block diagram of an electronic device according to some implementations.

An implementation of the present disclosure provides an electronic device, such as any of a mobile phone, a desktop computer, a tablet computer, a notebook computer, a server, a vehicle-mounted device, a wearable device (such as a smart watch, a smart bracelet, smart glasses, etc.), a mobile power supply, game consoles, digital multimedia players, etc. FIG. 1 shows a schematic diagram of an electronic device 10 provided by an implementation of the present disclosure, which includes a host 100 and a memory system 110. The host 100 is coupled to the memory system 110 to write data into the memory system 110 or read the data stored in the memory system 110. The host is also called a master, and the memory system is also called a slave. In the electronic device, the slave may be accessible to different masters. For example, if the electronic device is a cell phone, a central processing unit (CPU), a digital signal processor (DSP) and the like of the cell phone may serve as a host to access the memory system.

Figure 2:
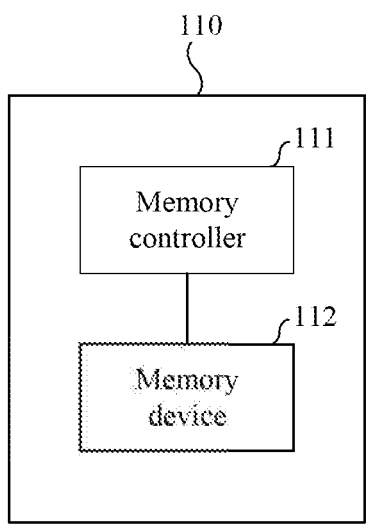
FIG. 2 is a block diagram of a memory system according to some implementations.

Exemplarily, FIG. 2 shows a schematic diagram of a memory system 110 provided by an implementation of the present disclosure. The memory system 110 includes a memory controller 111 and a memory device 112. The memory controller 111 is coupled to the memory device 112 to control the memory device 112 to store data.

The memory device 112 may be a two-dimensional (2D) memory device or a three-dimensional (3D) memory device.

The memory system 110 may be integrated into various types of storage devices. For example, the memory system 110 can be included in the same package (e.g., a universal flash storage (UFS) package or an embedded multi-media card (eMMC) package). That is, the memory system 110 may be applied to and packaged into different types of electronic products, for example, mobile phones (such as cell phones), desktop computers, tablet computers, notebook computers, servers, vehicle-mounted device, game consoles, printers, positioning devices, wearable devices, smart sensors, mobile power supplies, virtual reality (VR) devices, augmented reality (AR) devices, or any other suitable electronic devices having storage therein.

In some implementations, the memory system 110 includes a memory controller 111 and a memory device 112, and the memory system 110 may be integrated into a memory card. Memory cards include any of personal computer memory card international association (PCMCIA) cards (abbreviated as PC cards), compact flash (CF) cards, smart media (SM) cards, memory sticks, multimedia cards (MMC), secure digital (SD) cards, and UFS.

Figure 3:
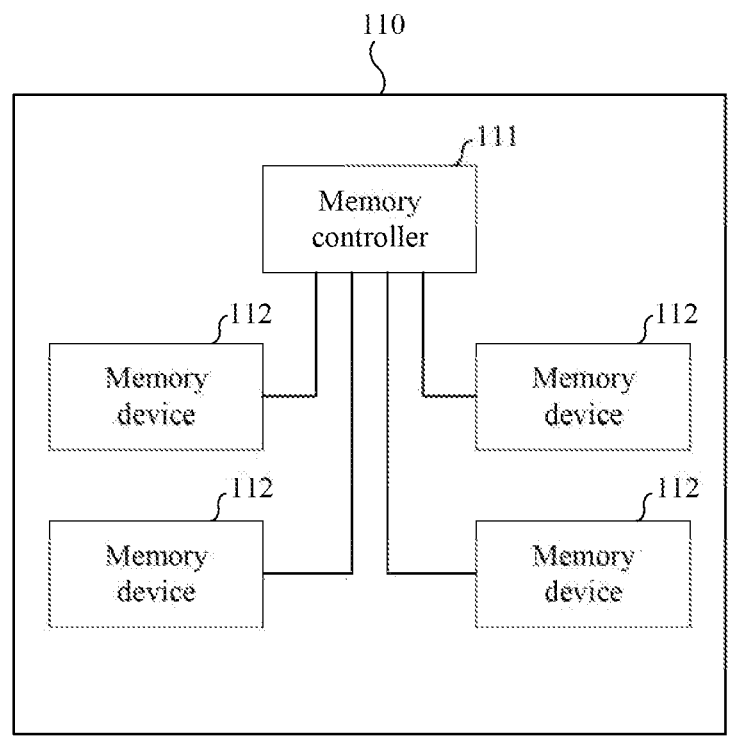
FIG. 3 is a block diagram of another memory system according to some implementations.

In some other implementations, referring to FIG. 3, the memory system 110 includes a memory controller 111 and multiple memory devices 112, and the memory system 110 is integrated into a solid state drive (SSD).

In the memory system 110, the memory controller 111 is configured to operate in a low duty-cycle environment, for example, in SD cards, CF cards, universal serial bus (USB) Flash drives, or other media used in electronic devices such as personal calculators, digital cameras, and mobile phones, according to some implementations.

In other further implementations, the memory controller 111 is configured to operate in a high duty-cycle environment SSDs or eMMCs used as data storage for mobile devices (such as smartphones, tablets, laptop computers, etc.) and enterprise storage arrays.

In some implementations, the memory controller 111 may be configured to manage data stored in the memory device 112 and communicate with external devices (e.g., the host 100). In some implementations, the memory controller 111 may be further configured to control operations of the memory device 112, such as read, erase, and program operations. In some implementations, the memory controller 111 may be further configured to manage various functions related to data stored or to be stored in the memory device 112, including at least one of bad block management, garbage collection (GC), logical to physical address transition, and wear leveling. In some implementations, the memory controller 111 is further configured to process error correction codes on data read from or written to the memory device 112.

Of course, the memory controller 111 may further perform any other suitable functions, such as flushing the buffer space of the memory device 112 or formatting the memory device 112, as provided by the implementations of the present disclosure.

In addition, the memory controller 111 may communicate with an external device (e.g., the host 100) via at least one of various interface protocols.

It is noted that the interface protocols include at least one of universal serial bus (USB) protocol, Microsoft management console (MMC) protocol, peripheral component interconnect (PCI) protocol, PCI Express (peripheral component interconnect express. PCI-E) protocol, advanced technology attachment (ATA) protocol, serial ATA protocol, parallel ATA protocol, small computer system interface (SCSI) protocol, enhanced small disk interface (ESDI) protocol, an integrated drive electronic (IDE) protocol, and a firewire protocol.

For example, when the storage medium of the memory device 112 is a flash memory, the basic memory cell of the flash memory includes a floating gate field effect transistor or a charge-trap transistor, etc. The implementations of the present disclosure will be described by using a charge-trap transistor as an example.

Figure 4:
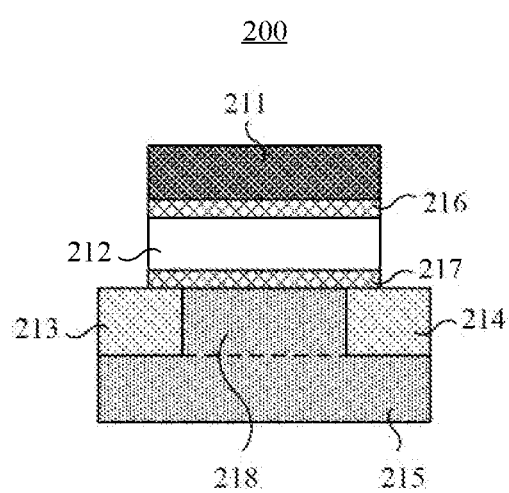
FIG. 4 is a schematic diagram of a floating gate field effect transistor according to some implementations.

FIG. 4 shows a schematic structural diagram of a charge-trap transistor, which includes a control gate 211, a charge trapping layer 212, a source 213, a drain 214, a substrate 215, an oxide layer 216, and a tunnel oxide layer 217. The source 213 and the drain 214 are arranged on the substrate 215. According to the implementation of the present disclosure, an N-channel charge trapping layer field effect transistor is taken as an example, in which the substrate 215 is made of a P-type semiconductor material, and the source 213 and the drain 214 are made of an N-type semiconductor material. The substrate material between the source 213 and the drain 214 may form a conductive channel 218, the charge trapping layer 212 overlays the conductive channel 218, and the tunnel oxide layer 217 is located between the charge trapping layer 212 and the conductive channel 218. The charge trapping layer 212 is separated from the source 213, the drain 214, and the conductive channel 218, the control gate 211 is arranged on the charge trapping layer 212, and an oxide layer 216 is arranged between the control gate 211 and the charge trapping layer 212, so as to separate the control gate 211 from the charge trapping layer 212. The oxide layer 216 and the tunnel oxide layer 217 are both made of an insulating material, such as silicon dioxide ($SiO_2$).

The charge trapping layer 212 is made of an insulating material with a high charge trapping density. When writing data, the charge trapping layer 212 traps electrons, and the threshold voltage of the field effect transistor changes accordingly. With such characteristics, data are stored. When erasing data, boles in the channel are injected into the charge trapping layer 212 to neutralize the electrons in the charge trapping layer 212 to realize erasing.

When electrons are trapped in the charge trapping layer, a higher threshold voltage is required to open the conductive channel due to the shielding effect of electrons. If the threshold voltage when no electrons are trapped in the charge trapping layer is denoted as $V_{th1}$ the threshold voltage when electrons are trapped in the charge trapping layer is denoted as $V_{th2}$, and it is assumed that a voltage greater than $V_{th1}$ but less than $V_{th2}$ is used to try to turn on charge trapping type transistor, when the charge trapping field effect transistor is turned on, it may be determined that no electrons are trapped in the charge trapping layer, and when the charge-trap transistor is not turned on, it may be determined that electrons are trapped in the charge trapping layer. Based on this logic, in the case of electrons being trapped in the charge trapping layer, the charge-trap transistor is in a turn-on state, indicating 1, and in the case of no electrons being trapped in the charge trapping layer, the charge-trap transistor is in a turn-off state, indicating 0. Thus, such different states can be used to store data. In this way, the storage function can be achieved through changing the threshold voltage of the charge-trap transistor by injecting or trapping electrons in the charge-trapping layer.

Figure 5:
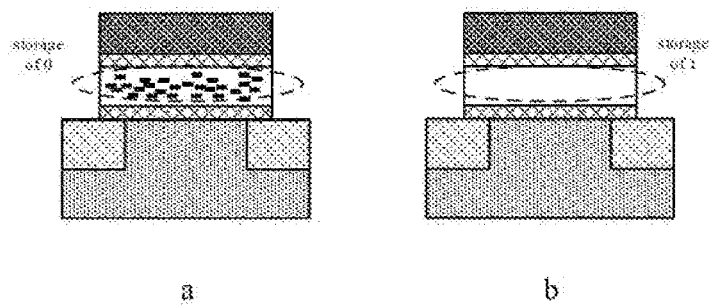
FIG. 5 is a schematic diagram of stored data of a floating gate field effect transistor according to some implementations.

When a voltage is applied to the control gate, a tunneling effect occurs based on the potential difference between the control gate and the channel and electrons may be injected into the charge trapping layer or trapped by the charge trapping layer. When storing data, the data are stored in the charge trapping layer, and the presence or absence of charges in the charge trapping layer may be used to indicate the data currently stored in the memory cell. For example, referring to FIG. 5, the state where the charge trapping layer has charges indicates storage of 0, as shown in FIG. 5a, and as shown in FIG. 5b, the state where the charge trapping layer has no charge indicates storage of 1. In some other examples, the number of electrons trapped in the charge trapping layer is used to indicate the storage of different data. For example, the number of charges in the charge trapping layer may indicate four states including high, medium, low, and none, then they may be used to indicate the storage of four types of data including 11, 10, 01, and 00.

Flash memories may be divided into a single-level cell (SLC), a multi-level cell (MLC), a triple-level cell (TLC), a quad-level cell (QLC), and other types. In different types of flash memories, memory cells store data in different ways.

Figure 6:
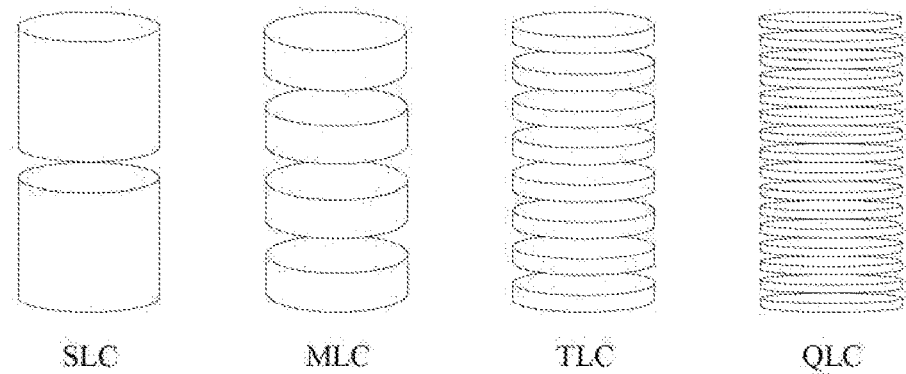
FIG. 6 is a schematic diagram of memory cells of different flash memories according to some implementations.

Exemplarily, in combination with FIG. 6, the memory cells of the SLC flash memory store different data depending on the presence or absence of the charges in the charge trapping layer, and each memory cell is used to store 1 bit data. For example, with reference to FIG. 5, when there are charges in the charge trapping layer, it means storage of 0, and when there is no charge in the charge trapping layer, it means storage of 1.

The memory cells of an MLC flash memory, a TLC flash memory, and a QLC flash memory store different data depending on the number of electrons captured in the charge trapping layer. When the number of electrons captured in the charge trapping layer is different, different charge states are presented. As an example, the number of charges in the charge trapping layer of the memory cell of MLC flash memory indicates four states of high, medium, low, and none, so that each memory cell may be used to store 2-bit data. For example, it may be used to store four binary data of 00, 01, 10, and 11.

The number of charges in the charge trapping layer of the memory cell of the TLC flash memory indicates eight states, and each memory cell may be used to store 3-bit data. For example, it may be used to store eight data states of binary 000, 001, 010, 011, 100, 101, 110, and 111.

The number of charges in the charge trapping layer of the memory cell of the QLC flash memory indicates sixteen states, and each memory cell may be used to store 4-bit data, and can store 16 binary data accordingly.

In addition, flash memories also include penta-level cell (PLC) flash memories, and each memory cell can store 5-bit data, and can store 32 binary data accordingly.

When data are written into the memory cell of the flash memory, the charge trapping layer is charged, and the charge trapping layer traps electrons to change the charge state in the charge trapping layer. Exemplarily, a voltage may be applied to the control gate, tunneling effect occurs based on the potential difference between the control gate and the channel, and electrons may be injected into the charge trapping layer.

The process of charging the control gate needs to be carried out step by step. The threshold voltage is gradually increased, and is compared with a preset boundary defined by different data at each step. This boundary is referred to as a reference voltage.

A memory cell of the SLC flash memory only needs to store 1-bit data, and only needs to distinguish two different states of 0 and 1. Therefore, a memory cell of the SLC flash memory only needs to use one reference voltage to store two different states.

To store 2-bit data, the MLC flash memory needs to distinguish four states: 00, 01, 10, and 11, and three reference voltages are required. Therefore, the writing process of the MLC flash memory becomes much slower than that of SLC flash memory.

Each memory cell of the TIC flash memory needs to store 3-bit data, and the state of binary data is increased to 8, and seven reference voltages are required to distinguish between these eight states. The writing process of the TLC flash memory cell thus requires more comparisons and confirmations, which causes that the write speed drops even lower.

QLC flash memory needs to store 4-bit data, and the write speed will be lower.

The memory cell of flash memory stores data mainly depending on the number of electrons captured by the floating gate in the memory cell, and electrons need to enter and exit the silicon dioxide layer used to block electrons through the tunneling effect (such as the tunnel oxidation layer 217 shown in FIG. 4) to enter the charge trapping layer. However, when electrons are injected during each tunneling, the atomic bonds of silicon dioxide will be gradually broken, so the erasing speed of data will be slower and slower. Electrons will slowly occupy the tunneling layer that would otherwise serve for insulation so as to offset the voltage applied to the control gate, resulting in a higher voltage that is required to complete the work, and this will cause the tunnel oxide layer to be broken down faster, until the entire tunnel oxide layer is penetrated by electrons, which means end of service life of the memory cell.

Different types of flash memory have different programming methods for reading and writing data, so the service life is also different. For example, the memory cell of an SLC flash memory stores only two states of 0) or 1, while the memory cell of a TLC flash memory stores eights states. To achieve such a variety of states, the TLC flash memory requires more comparisons and confirmations in the process of writing data, and electrons need to frequently enter and exit the tunnel oxide layer, so the service life of the TIC flash memory is shorter than that of the SLC memory cells. Under normal circumstances, the erasing and writing lifetime of the SLC flash memory may reach 100,000 times, but the erasing and writing lifetime of the TLC flash memory is only 500-1000 times, and the erasing and writing lifetime of a QLC flash memory is even shorter, only approximately 500 times.

The minimum writing unit of the flash memory is a page, and each page consists of multiple memory cells. As an example, a page includes 4.000 memory cells. A plurality of pages constitute a block. As an example, in the general case, 64 pages constitute a block, or 128 pages constitute a block. A flash memory is erased in units of blocks, and is written in units of pages.

Taking into account storage capacity, read/write speed, and cost, the current flash memories are mostly TLC flash memories. The capacity of a TLC flash memory is larger than that of an SLC flash memory, and the cost per unit capacity is lower, but the read/write speed of a TLC flash memory is not as fast as that of an SLC flash memory. UFS3.1 protocol has added a write booster function to enhance the write performance of flash memories.

Figure 7:
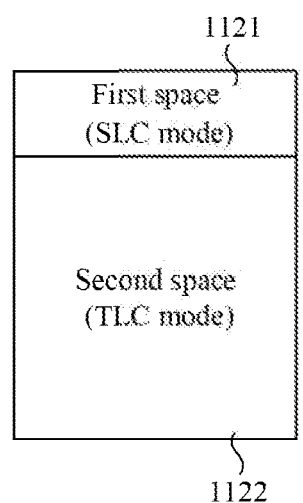
FIG. 7 is a schematic diagram of a memory device according to some implementations.

Referring to FIG. 7, write booster is implemented by configuring a part of the storage space of the memory device 112 as SLC mode, and this part of the space is used as a write booster buffer, called the first space 1121. The first space 1121 may be used to buffer data from the host in SLC mode, called also buffer space, while the rest of the storage space still stores data in TLC mode, called the second space. The second space can also be called normal space. When writing data into the memory device 112, the data may first be written into the first space 1121 in the SLC mode with a faster write speed, so as to improve the writing performance of the flash memory.

The size of the first space 1121 may be configured by the memory controller 111 according to the demand of the host 100. For example, referring to FIG. 1, the host 100 can interact with the memory system 110. When the memory system 110 is connected to the host 100, the host 100 may notify the memory system 110 of the size of the first space demanded by the host 100. The memory system 110 checks whether its own resources are sufficient to meet the demand of the host 100 for the first space. If its own resources are sufficient, a first space with the same size as demanded by the host may be configured. If its own resources are insufficient, then a first space that is smaller than the space as demanded by the host 100 may be configured.

When configuring the first space, the memory controller 111 may configure a parameter: the parameter representing the size of the first space (i.e., write booster buffer size). For example, the size of the first space demanded by the host 100 is 100 blocks, and the memory system 110 check whether its own resources are sufficient after receiving such demand. For example, the memory system 110 determines whether the size of its own free space is greater than or equal to 100 blocks. If the size of the free space is greater than or equal to 100 blocks, the memory controller 111 can configure a first space having 100 blocks in the memory device 112, that is, the parameter representing the size of the first space is configured as 100 blocks.

If the size of the free space of the memory system 110 is less than 100 blocks, then the memory device will be configured with a first space smaller than 100 blocks. For example, if the resources of the memory system 110 are insufficient, a first space with a size of only 80 blocks may be configured, and then the parameter representing the size of the first space may be configured as 80 blocks.

When the host 100 inquires the memory system 110 for the size of the first space, the memory controller 111 sends the configured parameter representing the size of the first space to the host 100 to notify the host 100 of the size of the first space 1121.

Exemplarily, if a flash memory chip includes 1000 blocks, 100 of them are configured in the SLC mode in response to the demand of the host, and are used as a write booster buffer. When writing data, data are written into the first space in the SLC mode. Compared with writing data in the TLC mode, writing data in the SLC mode can increase the write speed. When reading data stored in the SLC mode, the read speed is also faster. Therefore, the write booster function can not only improve the write performance of the flash memory, but also improve the read performance of the flash memory.

Further, the memory controller 111 stores a parameter representing the size of the available space (available buffer size) of the first space, where the parameter representing the size of the first space is used to indicate the size of the first space. For example, the size of the first space is 100 blocks; and the available buffer size of the first space is used to indicate the occupancy ratio of the available space of the first space. Initially, no data is stored in the first space 1121, all the first space 1121 is available space, and the occupancy ratio of the available space is 100%, so the initial value of the available buffer size of the first space is 100%.

After the first space 1121 is consumed, the available space of the first space 1121 decreases, and the available buffer size of the first space will also decrease accordingly. For example, the size of the first space is 100 blocks, and the initial value of the available buffer size of the first space is 100%. If 60 blocks have been used, the remaining 40 blocks are available, and the occupancy ratio is 40%, then the available buffer size of the first space is 40%.

Write booster configures a part of the storage space in the SLC mode as the first space to buffer data, which can enhance the read and write performance of the flash memory, but the size of the first space is not infinite. After the first space is used up, the first space needs to be flushed to release the first space.

A possible way to flush the first space is to move the data stored in the first space to a free space. To move the data, the data stored in the SLC mode needs to be taken out first, then stored in the free space in the TLC mode, and then the data stored in the SLC mode is erased. The free space here includes the available space of the first space and the available space of the second space. After all the data stored in the SLC mode in the first space are moved, the first space will be restored as the available space. The available buffer size of the first space is restored to 100%. When the available buffer size of the first space is restored to 100%, it may be considered that the flushing is completed (flush done).

For the memory system 110, whether to execute the flush action is configured by the host 100. For example, the memory controller 111 maintains a flush tag or a similar parameter. This parameter has two states, one is true, and the other is false. Exemplarily, the host 100 may send a first space flush command to the memory system 110, so as to configure the state of the flush tag maintained by the memory controller 111 as true.

The memory system 110 will check the state of the flush tag in the idle state in which no read or write commands are received from the host 100. If the state of the flush tag is checked to be true, the memory controller 111 controls the memory system 110 to perform the operation of flushing first space. The purpose of flushing is to release the first space, so that the available buffer size of the first space is restored to the initial size, that is, the same as the size of the first space. Specifically, the parameter representing the available buffer size of the first space is restored to 100%, to meet the host 100's demand for the first space. Of course, when the first space is not in use, that is, when the parameter representing the available buffer size of the first space is 100%, there is no need to perform flushing, and when the parameter representing the available buffer size of the first space is not 100%, flushing needs to be performed to release the first space.

When flushing the first space, the data stored in the SLC mode in the first space are moved to a free space, for example, the available space in the second space, and the moved data are stored in the TLC mode, so that after the data stored in the SLC mode are moved, the first space may be released to complete flushing.

Figure 8:
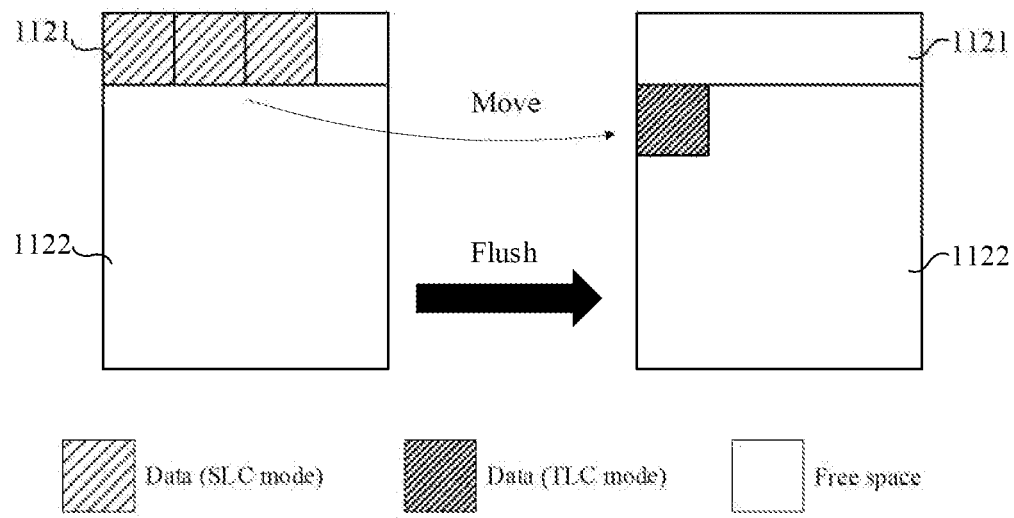
FIG. 8 is a schematic diagram of a first space flush according to some implementations.

For example, referring to FIG. 8, when flushing the first space, the data stored in the first space 1121 is moved to the second space 1122, and the used space of the first space is released and becomes available space again, so that all the space in the first space becomes available. The parameter representing the available buffer size of the first space is restored to 100%, and the flush operation is completed.

Figure 9:
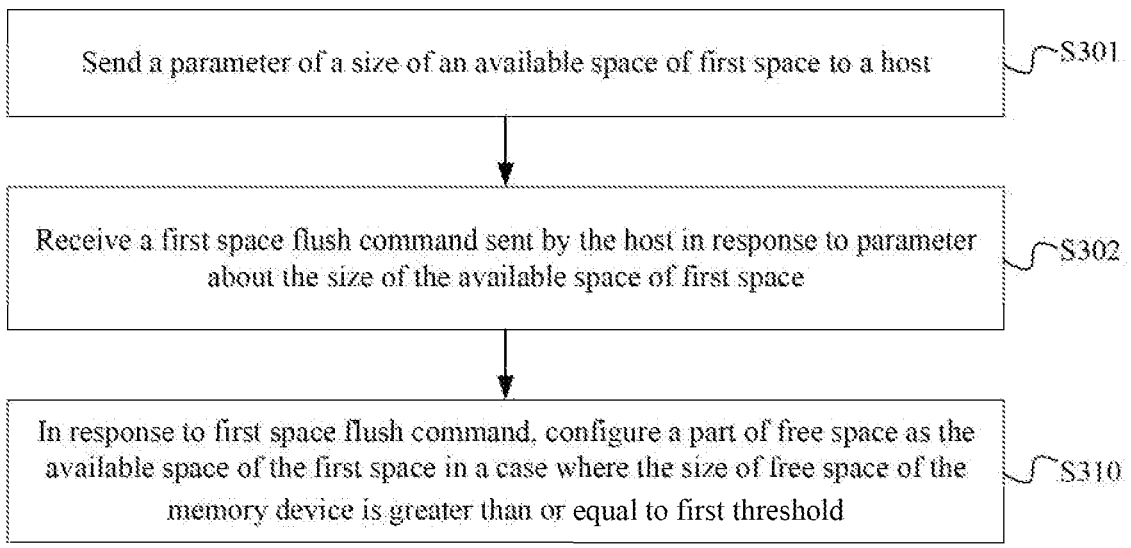
FIG. 9 is a schematic diagram of a first space flush according to another implementation.

During the flush, the data stored in the SLC mode is taken out from the first space and written into the second space in the TLC mode. In this way, moving 3 blocks of the data stored in the SLC mode only needs to occupy the size of 1 block in writing in the TLC mode, and free space of 2 blocks may be released. However, the waiting time for flushing by moving the data is longer, and after the data are moved, the data are stored in the TLC mode, and the reading speed is slower. Moving the data means that the number of times to write data increases, which in turn causes damage to the erasing and writing lifetime of the memory device, and will lead to an increase in write amplification. To alleviate the above problems, an implementation of the present disclosure provides a method for operating a memory system, which is applied to a memory controller of the memory system. The memory controller is coupled to the memory device, and the memory device includes a first space and a second space. The storage mode of the first space is a first mode, and the storage mode of the second space is a second mode. The write speed of the second mode is lower than that of the first mode. Correspondingly, the space occupied by storing the same size of data in the first mode is larger than in the second mode. Exemplarily, referring to FIG. 9, the method for operating the memory system provided by the implementations of the present disclosure includes:

S301: sending a parameter representing the size of the available space of the first space to the host.

Referring to FIG. 1, the host 100 will inquire the memory system 110 for the parameter representing the size of the first space, the parameter representing the size of the available space of the first space, etc. After receiving the inquire request from the host 100, the memory controller 111 can send to the host 100 the parameter representing the size of the first space, the parameter representing the size of the available space of the first space, etc.

S302: receiving the first space flush command sent by the host 100 in response to the parameter representing the size of the available space of the first space.

The host 100 may send the first space flush command to the memory controller according to its own demand. For example, when the host needs more first space for storing data, it may send the first space flush command to the memory controller. The memory controller is used to receive the first space flush command sent by the host in response to the parameter representing the size of the available space of the first space, and configure the status of the flush tag as true, so that the first space may be flushed in an idle state in which no read or write commands are received from the host.

S310: in response to the first space flush command, configuring a part of the free space as the available space of the first space in the case where the size of the free space of the memory device is greater than or equal to a first threshold.

Referring to the flush mode of the first space provided by the implementation shown in FIG. 8, the first space in the memory device is unchanged. After the first space is used up, if the first space is further needed to store data, then the data already stored in the first space needs to be moved to flush the first space, but this will result in a longer waiting time for the flush to complete.

Figure 10:
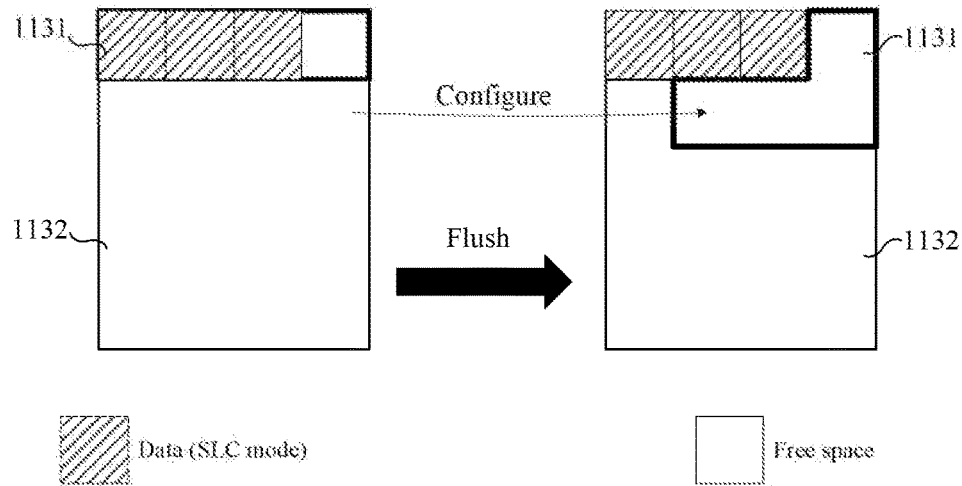
FIG. 10 is a schematic flowchart of a method for operating a memory system according to some implementations.

In accordance with the solution provided by the implementations of the present disclosure, in response to the first space flush command, it is determined whether the size of the free space of the memory device is greater than or equal to the first threshold upon performing the action of flushing the first space. If the size of the free space of the memory device is greater than or equal to the first threshold, the data already stored in the first space will not be moved, but a part of the free space will be configured as the available space of the first space, as shown in FIG. 10. The free space of the memory device includes the available space of the first space and the available space of the second space. In this way, it is not necessary to move the data stored in the first space, but to configure another space as the first space, which saves the process of moving the data stored in the first space, and shortens the waiting time for the completion of the first space flush.

In addition, because moving data will cause the data to be written again, the more times the data are written, the more the service life of the memory device will be reduced. According to the method for operating the memory system provided by the implementations of the present disclosure, in the case where the free space of the memory device is sufficient, the data stored in the first space is not moved when the first space is flushed, which reduces the number of times of data writing. As a result, the service life reduction of the memory device due to an increase in the number of times of writing can be avoided.

In accordance with the method for operating the memory system provided by the implementations of the present disclosure, configuring a part of the free space as the available space of the first space needs to meet a prerequisite, that is, the size of the free space is greater than or equal to the first threshold; otherwise, the first space cannot be configured. According to the different sizes of the free spaces, the implementations of the present disclosure provide different flush modes. For example, referring to FIG. 11, before S310, the method for operating the memory system provided by the implementations of the present disclosure further includes:

S303: in response to the first space flush command, determining whether the size of the free space of the memory device is greater than or equal to the first threshold.

In accordance with the method for operating the memory system provided by the implementations of the present disclosure, when flushing the first space, it is determined whether the size of the free space of the memory device is greater than or equal to the first threshold. If the size of the free space of the memory device is greater than or equal to the first threshold, S310 is executed, so as to configure a part of the free space as the available space of the first space, and restore the size of the available space of the first space into the initial value (that is, the same size as the first space), which means there is no need to move data. Therefore, the waiting time to flush the first space may be reduced.

Exemplarily, in an implementation, the memory controller manages the storage space of the memory device. For example, the memory device includes 30 blocks, and each block may be identified by a block number, respectively B0-B29. A part of the space is configured to store data of the host. For example, B0-B3 is configured as the first space, B4-B19 is configured as the second space, and the rest of the space may be configured to store the data of the memory device itself, or implement bad block management, redundancy management and other functions. When no data is stored in the first space, the management logic of the memory controller may be shown in Table 1:

TABLE 1

| | |
|---|---|
| Parameter representing the size/block of the first space | 4 |
| Available space of first space | B0、B1、B2、B3 |
| Parameter representing the size of available space of the first space | 100% |
| Size/block of the free space | 20 |
| Available space of the second space | B4、B5、B6、B7、B8、B9、B10、B11、B12、B13、B14、B15、B16、B17、B18、B19 |

In this way, when the host needs to store data in the first space, the memory controller checks that the available space of the first space includes B0, B1, B2, and B3. Then, when writing data, the data are stored in B0, B1, B2, and B3.

Exemplarily, if B0, B1, and B2 of the first space store data and become used Space, B3 does not store data and is a still available space. Correspondingly, the management logic of the memory controller changes correspondingly, as shown in Table 2.

TABLE 2

| | |
|---|---|
| Parameter representing the size/block of the first space | 4 |
| Available space of the first space | B3 |
| Parameter representing the size of the available space of the first space | 25% |
| Size/block of the free space | 17 |
| Available space of the second space | B4、B5、B6、B7、B8、B9、B10、B11、B12、B13、B14、B15、B16、B17、B18、B19 |

If the host sends the first space flush command to the memory system, the memory controller performs an operation of flushing the first space in response to the first space flush command.

Exemplarily, it is first decided whether the size of the free space of the memory device is greater than or equal to the first threshold, where the free space includes the available space of the first space and the available space of the second space. In the implementation of the present disclosure, the first threshold is the size of the first space. For example, the size of the first space is 4 blocks, and the first threshold is 4 blocks.

In combination with the above examples, the free space includes 17 blocks, which is larger than 4 blocks, that is, the size of the free space meets the demand for configuring the first space. In this case, a part of the free space is configured as the available space of the first space, so that the size of the available space of the first space is restored to the initial value, that is, the same as the size of the first space.

Exemplarily, in combination with Table 2, the size of the free space is 17 blocks, including the available space of the second space and the available space of the first space. The available space of the second space includes 16 blocks of B4-B19, and the available space of the first space includes one block, that is, B3. Thus, only the free space of B3, B4, B5, and B6 or of other four blocks needs to be configured as the free space of the first space, so that the available space of the first space is restored to 4 blocks again, restored into the initial value, and have the same size as the first space.

For example, since B3 is the available space of the first space, the three blocks B4, B5, and B6 may be configured as the available space of the first space. Correspondingly, the management logic of the memory controller is adjusted as shown in Table 3:

TABLE 3

| | |
|---|---|
| Parameter representing the size/block of the first space | 4 |
| Available space of first space | B3、B4、B5、B6 |
| Parameter representing the size of the available space of first space | 100% |
| Size/block of the free space | 17 |
| Available space of the second space | B7、B8、B9、B10、B11、B12、B13、B14、B15、B16、B17、B18、B19 |

The memory controller configures a part of the free space as the available space of the first space. For example, B3, B4, B5 and B6 in the above example are configured as the available space of the first space, so that the size of the available space of the first space is restored into the initial value, that is, the size of the first space, which can meet the capacity demand of the host for the first space.

In addition, since the flushing process of the first space does not involve data movement, the number of data writes is reduced. On one hand, the waiting time for flushing the first space may be reduced, and on the other hand, reduction in data movement and data writing may prolong the erase and write lifetime of the memory and reduce write amplification. In addition, because the data stored in the first mode has not been moved, the reading speed is faster compared with reading the data stored in the second mode, when reading these data.

As mentioned in the forgoing examples, the host may inquire the memory system for the parameter representing the size of the first space, the parameter representing the size of the available space of the first space, etc. Further, after configuring a part of the free space as the available space of the first space, the method for operating the memory system provided by the implementations of the present disclosure further includes:

S320: configuring the parameter representing the size of the available space of the first space as an initial value.

The parameter representing the size of the available space of the first space includes an occupancy ratio of the size of the available space of the first space to the size of the entire first space. The initial value is 100%, at which time, the available space of the first space is the same as the first space in size, and the entire first space is available space. In response to the first space flush command, the size of the available space of the first space is restored into the size of the first space, after configuring a part of the free space as the available space of the first space, in the case where the size of the free space of the memory device is greater than or equal to the first threshold. Correspondingly, the parameter representing the size of the available space of the first space is configured as an initial value. That is, the flushing operation is completed. For example, in the above example, the parameter representing the size of the available space of the first space is configured from 25% to 100%, after configuring B3, B4, B5, and B6 as the available space of the first space. The parameter representing the size of the available space of the first space is restored to 100% during flushing of the first space, and it may be confirmed that the flush is completed.

The above examples take the size of the free space of the memory device being greater than or equal to the first threshold as an example to describe the disclosure, but in some cases, the size of the free space of the memory device may be insufficient, for example, smaller than the first threshold. In this case, the size of the free space of the space is insufficient to configure the first space. As mentioned in the preceding examples, storing the data stored in the SLC mode into the free space in the TlC mode may release a part of the free space, so the data stored in the first mode may be moved and a part of the free space may be released. After the free space is released, it is decided whether the size of the free space is sufficient to configure the first space.

Figure 11:
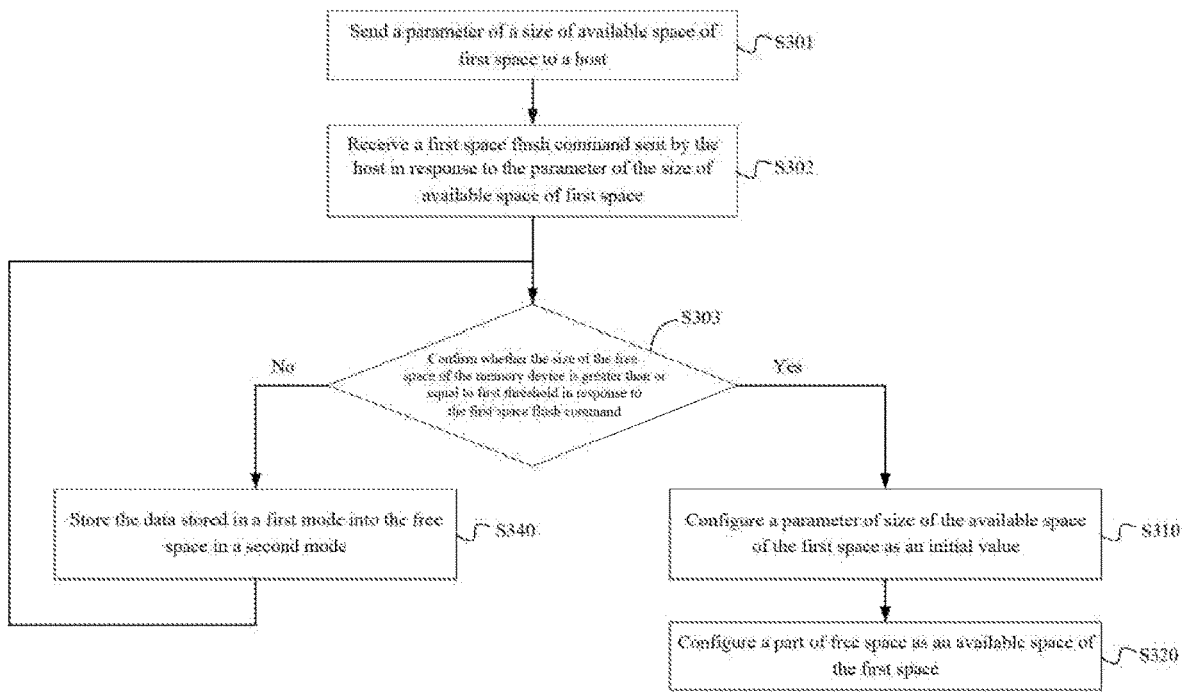
FIG. 11 is a schematic flowchart of a method for operating a memory system according to some implementations.

Exemplarily, with reference to FIG. 11, the method for operating the memory system provided by the implementations of the present disclosure further includes:

S340: storing the data stored in the first mode into the free space in the second mode.

When the size of the free space of the memory device is smaller than the first threshold, the data stored in the first mode in the memory device is stored into the free space in the second mode, so that a part of the free space may be released. After the extra free space is released, S303 is executed to decide whether the size of the free space is greater than or equal to the first threshold.

Exemplarily, it is taken as an example that the first mode includes the SLC mode and the second mode includes the TLC mode. In the case of the same size of data, the space occupied by storage in the SLC mode is three times that of storage in the TLC mode. Assuming that there are 3 blocks of data stored in the SLC mode, storing the data stored in these 3 blocks in the TLC mode into the free space will only occupy the size of 1 block of free space. After the data are moved, the moved data stored in the SLC mode is erased, which may release 3 blocks of free space. In this way, the movement of the data occupies 1 block of free space, but releases 3 blocks of free space. That is, an additional 2 blocks of free space are released. It can be seen that storing the data stored in the first mode into the free space in the second mode may release additional free space. The more data to be moved, the larger the free space to be released. If the size of the free space is greater than or equal to the first threshold after data movement, S310 may be executed to configure a new first space.

There are two cases of moving the data stored in the first mode to the free space. One case is that there is free space, then the data stored in the first mode may be stored into the free space in the second mode.

In another case, if there is no free space, all the space has been used. In this case, a third space needs to be borrowed to move the data.

The third space may be a reserve space of the memory device, or it can also be called over-provisioning (OP), which means an additional part of the space that is configured to store the data of the memory device itself, and to realize data movement, garbage collection, and so on, in addition to the first space and the second space of the memory device for storing the data of the host.

Figure 12:
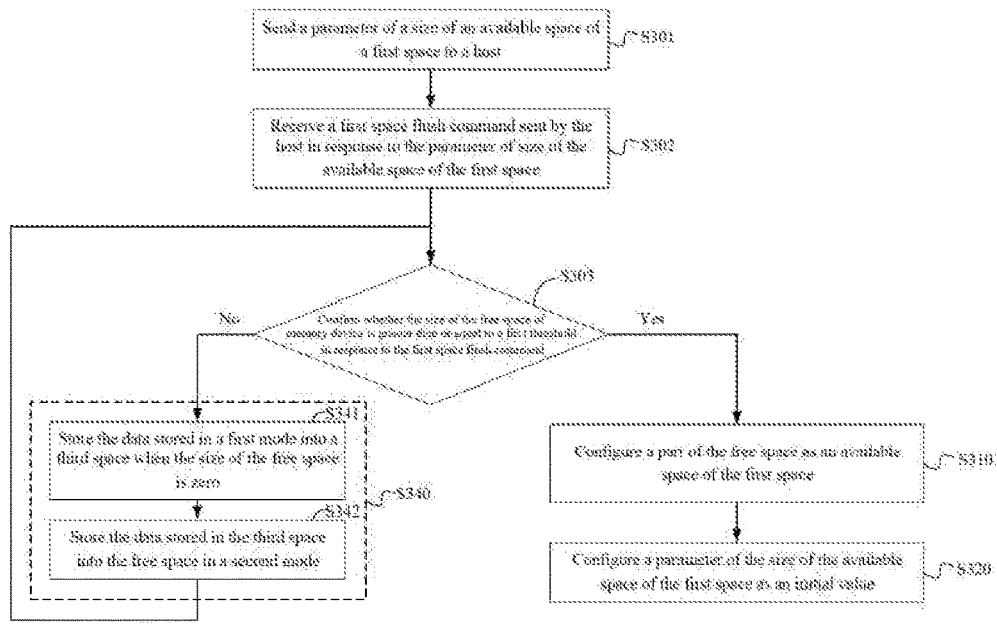
FIG. 12 is a schematic flowchart of a method for operating a memory system according to some implementations.

Exemplarily, in the case that there is no free space, that is, the size of the free space is zero, referring to FIG. 12, S340 includes:

S341: when the size of the free space is zero, storing the data stored in the first mode into the third space.

After the data stored in the first mode is stored into the third space, a part of free space may be released. Exemplarily, the data stored in the first mode may be stored into the third space in the second mode. Alternatively, the data stored in the first mode may be stored into the third space in the first mode.

For example, combined with the preceding examples, taking the first mode including the SLC mode and the second mode including the TLC mode as an example, when the data stored in the SLC mode is stored into the third space in the TLC mode, all the space for the moved data can be released. For example, the data of 3 blocks stored in the SLC mode are moved to 1 block of the third space. After erasing the moved data stored in SLC mode, free space of 3 blocks can be released.

S342: storing the data stored in the third space into the free space in the second mode.

Since moving data to the third space can release free space, and the third space is generally not used as a regular space for storing data, the data moved to the third space also needs to be moved out of the third space after releasing the free space. For example, the data stored in the third space is stored into the released free space in the second mode.

Exemplarily, combined with the preceding examples, the data of 3 blocks stored in the SLC mode are moved to 1 block in the third space to release the free space of 3 blocks, and then the data stored in the third space is moved to the released free space. Since the storage to the free space is done in TLC, it still occupies one block of free space, thereby releasing the third space. After the data are moved in this way, a free space of 2 blocks is released.

After the data are moved, an extra free space is released. If the size of the free space is still smaller than the first threshold, then the data stored in the first mode may be continuously moved until the size of the free space after moving the data is greater than or equal to the first threshold, or until all the data stored in the first mode is moved.

The data stored in the first mode are stored into the free space in the second mode to release more free space, but the premise is that the data stored in the first mode needs to exist before the data may be moved and the free space is released. If all the data in the memory device is stored in the second mode, no more free space will be released even if the data is moved.

Figure 13:
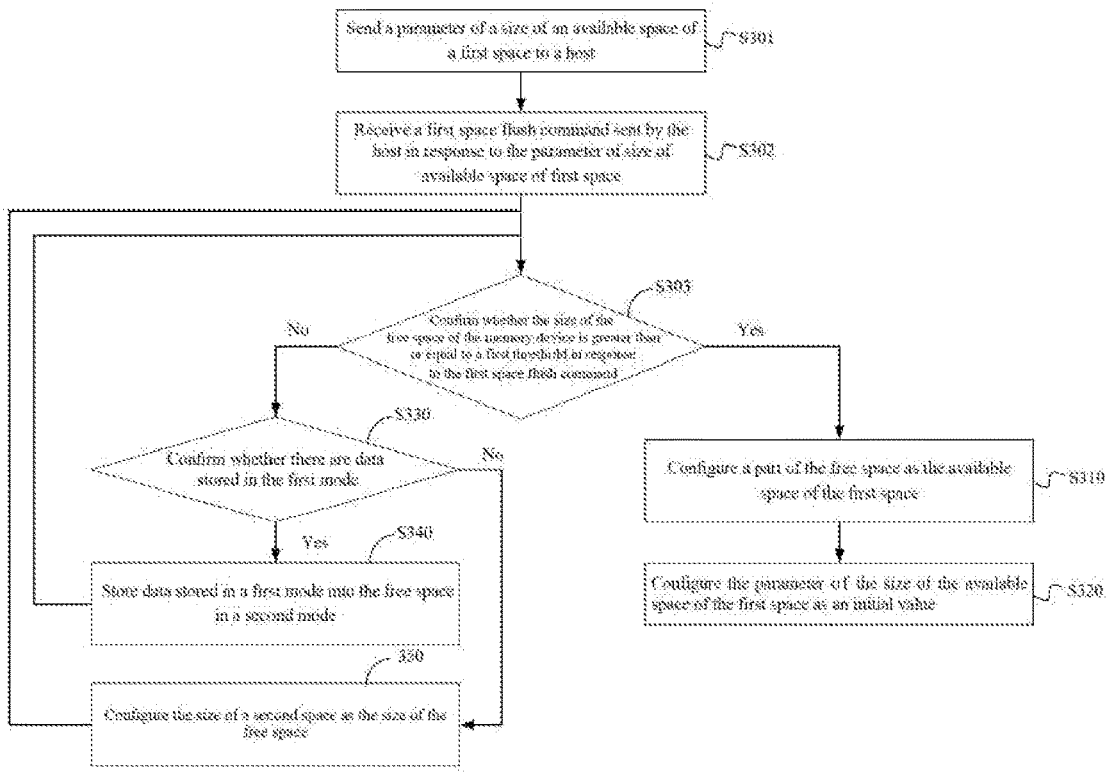
FIG. 13 is a schematic flowchart of a method for operating a memory system according to some implementations.

Exemplarily, referring to FIG. 13, before S340, the method further includes:

S330: confirming whether there is data stored in the first mode.

If there is data stored in the first mode. S340 is executed to store the data stored in the first mode into the free space in the second mode.

In the above examples, taking as an example that the size of the free space is smaller than the first threshold and there is data stored in the first mode in the memory device. In this case, the data stored in the first mode may be stored into the free space in the second mode, to release an additional free space.

But in another case, there may be no data stored in the first mode. That is, all the data stored in the first mode has been moved. In this case, on one hand, the size of the free space is insufficient to configure the first space, and on the other hand, it is impossible to release more free space by moving the data stored in the first mode. In this case, in order to complete the operation of flushing the first space, the method provided by the implementations of the present disclosure further includes:

S350: configuring the size of the first space as the size of the free space.

In this case, the size of the free space is smaller than the first threshold, and flushing cannot be completed by configuring the first space, and since all the data stored in the first mode has been moved, there is no data stored in the first mode. To complete operation of flushing the first space, the parameter representing the size of the first space is configured as the size of the free space.

For example, the parameter representing the size of the first space is 4 blocks, and after moving all the data stored in the first mode, there are 2 blocks left in the free space. In this case, the size of the free space is smaller than 4 blocks and the requirement of configuring the first space cannot be met. Therefore, the size of the first space is configured as the size of the free space. It may be implemented by configuring the parameter representing the size of the first space as the size of the free space. For example, in combination with the above examples, the size of the first space is configured as 2 blocks. Thus, as the size of the free space is 2 blocks and the size of the first space is 2 blocks, the free space can be configured as the available space of the first space. As the available space of the first space is 2 blocks, the parameter representing the size of the available space of the first space can be configured as 100%, and the flushing of the first space is completed.

However, the size of the first space is set according to the demand of the host. In the above examples, configuring the size of the first space as the size of the free space is equivalent to reducing the first space, which may not meet the capacity demand of the host for the first space. Therefore, after the flash of the first space is completed, the parameter representing the size of the first space will be reconfigured to the initial value. For example, in combination with the above examples, the parameter of the size of the first space will be reconfigured from 2 blocks to 4 blocks, to meet the capacity demand of the host for the first space.

In all of the above examples, the first mode includes the SLC mode, and the second mode includes the TLC mode. In other implementations of the present disclosure, the first mode may include the SLC mode, and the second mode may include any one of the MLC mode, a TLC mode, a QLC mode or PLC.

Alternatively, the first mode may include an MIC mode, and the second mode may include any one of a TLC mode, a QLC mode, or a PLC mode, and the like.

Figure 14:
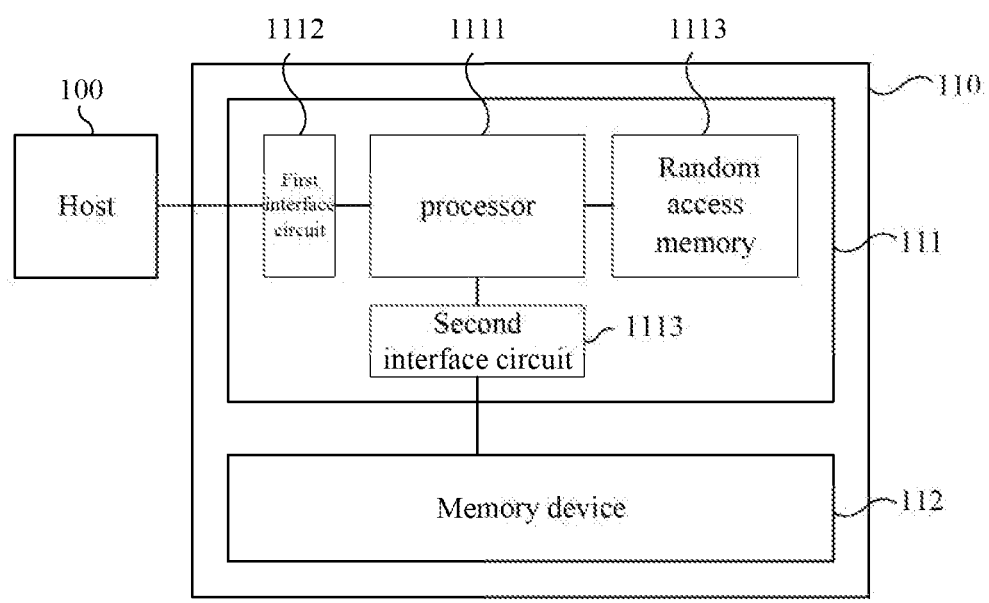
FIG. 14 is a block diagram of a memory system according to other implementations.

Referring to FIG. 14, an implementation of the present disclosure further provides a memory controller 111. The memory controller 111 includes a first interface circuit 1112, a second interface circuit 1113, and a processor 1111. The memory controller 111 is coupled to the memory device 112. The memory device 111 includes a first space and a second space, the storage mode of the first space is the first mode, the storage mode of the second space is the second mode, and the write speed of the second mode is lower than that of the first mode.

The processor 1111 is connected to the host 100 via the first interface circuit 1112, and is connected to the memory device via the second interface circuit 1113. The first interface circuit 1112 is configured to receive the first space flush command. The processor 1111 is configured to, in response to the first space flush command, configure a part of the free space as the available space of the first space in the case where the size of the free space of the memory device 112 is greater than or equal to the first threshold, where the free space of the memory device 112 includes the available space of the first space and available space of the second space.

In an implementation of the present disclosure, the memory controller 111 includes a random access memory 1113, and the random access memory 1113 stores a parameter representing the size of the available space of the first space. The parameter representing the size of the available space of the first space includes the occupancy ratio of the size of the available space of the first space to the size of the first space. The initial value of the occupancy ratio is 100%. That is, all of the first space is available space. The processor 1111 is further configured to configure the parameter representing the size of the available space of the first space stored in the random access memory 1113 as an initial value, namely 100%, after configuring a part of the free space as the available space of the first space.

In addition to the random access memory 1113, the memory controller 111 may further be provided with devices such as registers and caches to store the above parameters.

In an implementation of the present disclosure, the processor 1111 is further configured to store the data stored in the first mode into the free space in the second mode in the case where the size of the available space of the free space is smaller than the first threshold, so that a part of the free space may be released. After the free space is released, the part of the free space may be configured as the available space of the first space in the case where the size of the free space is greater than or equal to the first threshold.

In an implementation of the present disclosure, the memory device 112 includes a third space, and the processor 1111 is further configured to store the data stored in the first mode into the third space in the case where the size of the free space of the memory device 112 is zero, so that a part of free space may be released. The processor 1111 is further configured to move the data stored in the third space to the released free space.

In an implementation of the present disclosure, when the size of the free space is smaller than the first threshold, the processor 1111 is further configured to configure the size of the first space to the size of the free space if there is no data stored in the first mode, which is equivalent to reducing the size of the first space, so that the size of the free space is the same as that of the first space. The free space may be configured as the available space of the first space to complete the flushing of the first space.

Implementations of the present disclosure further provide a memory system, such as the memory system 110 as shown in FIG. 2, FIG. 3, and FIG. 14. The memory system 110 includes memory 112 and the memory controller 111 provided in above mentioned examples. The memory controller 111 is coupled to the memory device 112 to control the memory device 112 to store data.

Exemplarily, the memory controller 111 is configured to, in response to the first space flush command, configure a part of the free space as available space of the first space in the case where the free space of the memory device 112 is greater than or equal to a first threshold. The free space of the memory device 112 includes the available space of the first space and the available space of the second space.

In an implementation of the present disclosure, the memory controller 111 includes a random access memory 112, and the random access memory 112 stores a parameter representing the size of the available space of the first space. The parameter representing the size of the available space of the first space includes an occupancy ratio of the size of the available space of the first space to the size of the first space. The memory controller 111 is configured to configure the parameter representing the size of available space of the first space stored in the random access memory 112 as an initial value, after configuring a part of the free space as the available space of the first space. In addition to the random access memory 1113, the memory controller 111 may be provided with devices such as registers and caches to store the above parameters.

In an implementation of the present disclosure, before configuring the part of the free space as the available space of the first space, the memory controller 111 is further configured to, when the size of available space of the free space is smaller than the first threshold, store data stored in the first mode into the free space in the second mode.

In an implementation of the present disclosure, the memory controller 111 is further configured to store the data stored in the first mode into the third space when the size of the free space is zero. The memory controller 111 is further configured to move the data stored in the third space to the free space.

In an implementation of the present disclosure, when the size of the free space of the memory device 112 is smaller than the first threshold, the memory controller 111 is further configured to configure the parameter of the size of the first space as the size of the free space if there is no data stored in the first mode, and the parameter representing the size of the first space is used to indicate the size of the first space.

Implementations of the present disclosure further provide an electronic device, such as the electronic device 10 shown in FIG. 1 in the above examples, including the host 100 and the memory system 110 as provided in the forgoing implementations. The host 100 is connected to the memory system 110 to write data into the memory system 110 or read data stored in the memory system.

In some implementations, the host 100 is configured to send a first space flush command to the memory system.

In some implementations, the memory system 110 is configured to send the parameter representing the size of the available space of the first space to the host 100. The parameter representing the size of the available space of the first space includes the occupancy ratio of size of the available space of the first space to the size of the first space. The host 100 is configured to send the first space flush command to the memory system 110 in response to the parameter representing the size of the available space of the first space, and the memory system 110 receives the first space flush command, and flushes the first space in response to the first space flush command.

The above descriptions are merely specific implementations of the present disclosure, and the scope of the present disclosure is not limited thereto. Any variations or substitutions that may be easily conceived by those skilled in the art within the technical scope disclosed in the present disclosure are all covered within the scope of the present disclosure. Therefore, the scope of the present disclosure should be determined by the scope of the claims.

What is claimed is:

1. A method for operating a memory system, the memory system comprising a memory controller and a memory device, the memory controller being coupled to the memory device, the memory device having a first space and a second space, the first space having an initial size, a storage mode for the first space being a first mode, a storage mode for the second space being a second mode, a write speed of the second mode being lower than that of the first mode, the method comprising:

in response to a first space flush command for performing a flush operation that empties the first space, restoring an available size of the first space to the initial size of the first space by configuring a part of a free space of the memory device as an available space of the first space in a case where a size of the free space is greater than or equal to a first threshold, the free space of the memory device including a free space in the first space and a free space in the second space.

2. The method for operating the memory system according to claim 1, wherein the controller stores a parameter representing the available size of the first space, the parameter representing the available size of the first space includes an occupancy ratio, the occupancy ratio being calculated as a ratio of the available size of the first space to the initial size of the first space, and after configuring the part of the free space as the available space of the first space, the method further comprises:
configuring the parameter representing the available size of the first space as an initial value of the parameter.

3. The method for operating the memory system according to claim 1, further comprising:
storing, by the controller, data stored in the first mode into the free space in the second mode, in a case where the size of the free space is smaller than the first threshold.

4. The method for operating the memory system according to claim 3, wherein the memory device includes a third space, and the storing the data stored in the first mode into the free space in the second mode comprises:
in a case where the size of the free space is zero, storing the data stored in the first mode into the third space in the second mode; and
moving the data stored in the second mode in the third space to the free space.

5. The method for operating the memory system according to claim 4, further comprising:
after moving the data stored in the second mode in the third space to the free space, determining if the size of the free space is still smaller than the first threshold, and
upon a determination that the size of the free space is still smaller than the first threshold, repeating the operation of:
storing the data stored in the first mode into the free space in the second mode, and
moving the data stored in the second mode in the third space to the free space, until the size of the free space is greater than or equal to the first threshold, or until all data stored in the first mode is moved.

6. The method for operating the memory system according to claim 1, further comprising:
in a case where the size of the free space is smaller than the first threshold, updating the initial size of the first space as the size of the free space if there is no data stored in the first mode.

7. The method for operating the memory system according to claim 1, wherein the memory controller stores a parameter representing the available size of the first space, the parameter representing the available size of the first space includes an occupancy ratio, the occupancy ratio being calculated as a ratio of the available size of the first space to the initial size of the first space, and before configuring the part of the free space as the available space of the first space, the method further comprises:
sending the parameter representing the available size of the first space to a host; and
receiving the first space flush command from the host, the first space flush command being sent by the host in response to the parameter representing the available size of the first space.

8. The method for operating the memory system according to claim 1, wherein the first threshold is equal to the initial size of the first space.

9. The method for operating the memory system according to of claim 1, wherein the first mode includes a single-level cell (SLC) mode, and the second mode includes a multi-level cell (MLC) mode, a three-level cell (TLC) mode, or a quad-level cell (QLC) mode.

10. A memory controller, the memory controller being coupled to a memory device, the memory device having a first space and a second space, the first space having an initial size, a storage mode of the first space being a first mode, a storage mode of the second space being a second mode, a write speed of the second mode being lower than that of the first mode, the memory controller comprising a first interface circuit and a processor, wherein
the first interface circuit is configured to receive a first space flush command for performing a flush operation that empties the first space, and
the processor is configured to, in response to the first space flush command, restore an available size of the first space to the initial size of the first space by configuring a part of a free space of the memory device as an available space of the first space in a case where a size of the free space is greater than or equal to a first threshold, the free space of the memory device including a free space in the first space and a free space in the second space.

11. The memory controller according to claim 10, further comprising a random access memory, the random access memory storing a parameter representing the available size of the first space, the parameter representing the available size of the first space including an occupancy ratio, the occupancy ratio being calculated as a ratio of the available size of the first space to the initial size of the first space,
wherein the processor is configured to configure, after configuring the part of the free space as the available space of the first space, the parameter representing the available size of the first space stored in the random access memory as an initial value of the parameter.

12. The memory controller according to claim 10, wherein the processor is further configured to store data stored in the first mode into the free space in the second mode, in a case where the size of the free space is smaller than the first threshold.

13. The memory controller according to claim 12, wherein the memory device includes a third space, and the processor is configured to:
store the data stored in the first mode into the third space in the second mode in a case where the size of the free space is zero; and move the data stored in the second mode in the third space to the free space.

14. The memory controller according to claim 13, wherein the processor is further configured to:
after moving the data stored in the second mode in the third space to the free space, determine if the size of the free space is still smaller than the first threshold, and upon a determination that the size of the free space is still smaller than the first threshold, repeat the operation of:
  storing the data stored in the first mode into the free space in the second mode, and
  moving the data stored in the second mode in the third space to the free space, until the size of the free space is greater than or equal to the first threshold, or until all data stored in the first mode is moved.

15. The memory controller according to claim 12, wherein the processor is further configured to:
  in a case where the size of the free space is smaller than the first threshold, update the initial size of the first space as the size of the free space if there is no data stored in the first mode.

16. A memory system, comprising:
  a memory device; and
  a memory controller,
  wherein the memory controller is coupled to the memory device, the memory device having a first space and a second space, the first space having an initial size, a storage mode of the first space being a first mode, and a storage mode of the second space being a second mode, a write speed of the second mode being lower than that of the first mode, and
  the memory controller is configured to: in response to a first space flush command for performing a flush operation that empties the first space, restore an available size of the first space to the initial size of the first space by configuring a part of a free space of the memory device as an available space of the first space in a case where a size of the free space is greater than or equal to a first threshold, the free space of the memory device including a free space in the first space and a free space in the second space.

17. The memory system according to claim 16, wherein the memory controller includes a random access memory, the random access memory storing a parameter representing the available size of the first space, the parameter representing the available space available size of the first space including an occupancy ratio, the occupancy ratio being calculated as a ratio of the available size of the first space to the initial size of the first space, and
  the memory controller is configured to:
    after configuring the part of the free space as the available space of the first space, configure the parameter representing the available size of the first space as an initial value of the parameter.

18. The memory system according to claim 16, wherein the memory controller is further configured to:
  in a case where the size of the free space is smaller than the first threshold, store the data stored in the first mode into the free space in the second mode.

19. The memory system according to claim 18, wherein the memory device includes a third space, and the memory controller is configured to:
  store, in a case where the size of the free space is zero, the data stored in the first mode into the third space in the second mode, and move the data stored in the second mode in the third space to the free space.

20. The memory system according to claim 18, wherein the memory controller is further configured to:
  in a case where the size of the free space is smaller than the first threshold, update the initial size of the first space as the size of the free space if there is no data stored in the first mode.

\* \* \* \* \*